United States Patent
Godo et al.

(10) Patent No.: US 8,570,780 B2
(45) Date of Patent: Oct. 29, 2013

(54) SEMICONDUCTOR DEVICE

(75) Inventors: Shinsuke Godo, Tokyo (JP); Atsunobu Kawamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 21 days.

(21) Appl. No.: 13/396,934

(22) Filed: Feb. 15, 2012

(65) Prior Publication Data

US 2012/0307532 A1 Dec. 6, 2012

(30) Foreign Application Priority Data

Jun. 3, 2011 (JP) .................................. 2011-124895

(51) Int. Cl.
*H02H 7/122* (2006.01)
*H02H 9/04* (2006.01)

(52) U.S. Cl.
USPC ...................... 363/56.12; 363/56.05; 361/91.7

(58) Field of Classification Search
USPC .................... 363/50, 52, 56.05, 56.11, 56.12; 361/91.7
See application file for complete search history.

(56) References Cited

U.S. PATENT DOCUMENTS

| 5,729,446 A * | 3/1998 | Gruning ........................... 363/58 |
| 7,009,828 B2 * | 3/2006 | Ito et al. ......................... 361/91.8 |
| 2011/0310645 A1 | 12/2011 | Godo |

FOREIGN PATENT DOCUMENTS

| JP | 2002-208850 A | 7/2002 |
| JP | 4323073 | 6/2009 |

OTHER PUBLICATIONS

Office Action mailed Jul. 25, 2013 in Korean Patent Application No. 10-2012-0056547.

* cited by examiner

*Primary Examiner* — Gary L Laxton
(74) *Attorney, Agent, or Firm* — Oblon, Spivak, McClelland, Maier & Neustadt, L.L.P.

(57) ABSTRACT

A semiconductor device includes: a parallel connection structure 1 between a first node and a second node; a first snubber device and a second snubber device having a clamp level that is the same as or higher than the output voltage of a power source section. One terminal of the first snubber device is connected through the first node to one end of the parallel connection structure, the opposite terminal of the first snubber device is connected through a third node to one terminal of the second snubber device, and the opposite terminal of the second snubber device is connected through the second node to the opposite end of the parallel connection structure. Electric power is fed back to the power source section through the second and third nodes.

16 Claims, 15 Drawing Sheets

SURFACE REGION WHERE ELECTRIC FIELD IS RELAXED
(GUARD RING, FIELD PLATE)

SEMICONDUCTOR DEVICE

BACKGROUND OF THE INVENTION

1. Field of the Invention

The present invention relates to a semiconductor device that suppresses a surge voltage.

2. Description of the Background Art

In an inverter semiconductor module (inverter circuit) or a chopper circuit using a switching element of a high switching speed such as an IGBT, turning the switching element off generates rapid current change. As a result, a high voltage (turn-off surge voltage) is generated in response to the floating inductance of a main circuit. Meanwhile, even in the presence of a freewheeling diode (recovery diode), a high voltage (recovery surge voltage) is still generated based on the same principles when the freewheeling diode is turned off.

So, in order to maintain the safe operating area (SOA) of a switching element, a snubber circuit for reducing a surge voltage to be generated during turn-off is provided in an inverter circuit having an inverter bridge or a chopper circuit. Such a snubber circuit is disclosed for example in Japanese Patent Publication No. 4323073.

In a conventional semiconductor device with a snubber circuit, the snubber circuit converts a surge voltage to Joule heat, and dissipates the heat. In other word, part of electric power energy supplied is gone to waste uselessly, so it is regarded as undesirable in terms of energy saving.

SUMMARY OF THE INVENTION

It is an object of the present invention to provide a technique that allows effective use of the energy of a surge voltage.

The present invention is intended for a semiconductor device, including: a parallel connection structure in which a main switching element and a first diode are connected in parallel between a first node and a second node; a first snubber device having a clamp level that does not exceed the breakdown voltage of the main switching element; and a second snubber device having a clamp level that is the same as or higher than the output voltage of a power source section for supplying electric power to a drive circuit for driving the main switching element. One terminal of the first snubber device is connected through the first node to one end of the parallel connection structure, the opposite terminal of the first snubber device is connected through a third node to one terminal of the second snubber device, and the opposite terminal of the second snubber device is connected through the second node to the opposite end of the parallel connection structure. Electric power is fed back to the power source section through the second and third nodes.

Electric power is fed back to the power source section through the second and third nodes. So, while a surge voltage is consumed uselessly in a conventional example, the power source section is capable of using part of the surge voltage as electric power to be supplied to the drive circuit next time. Thus, the energy of the surge voltage can be used effectively to realize energy saving.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
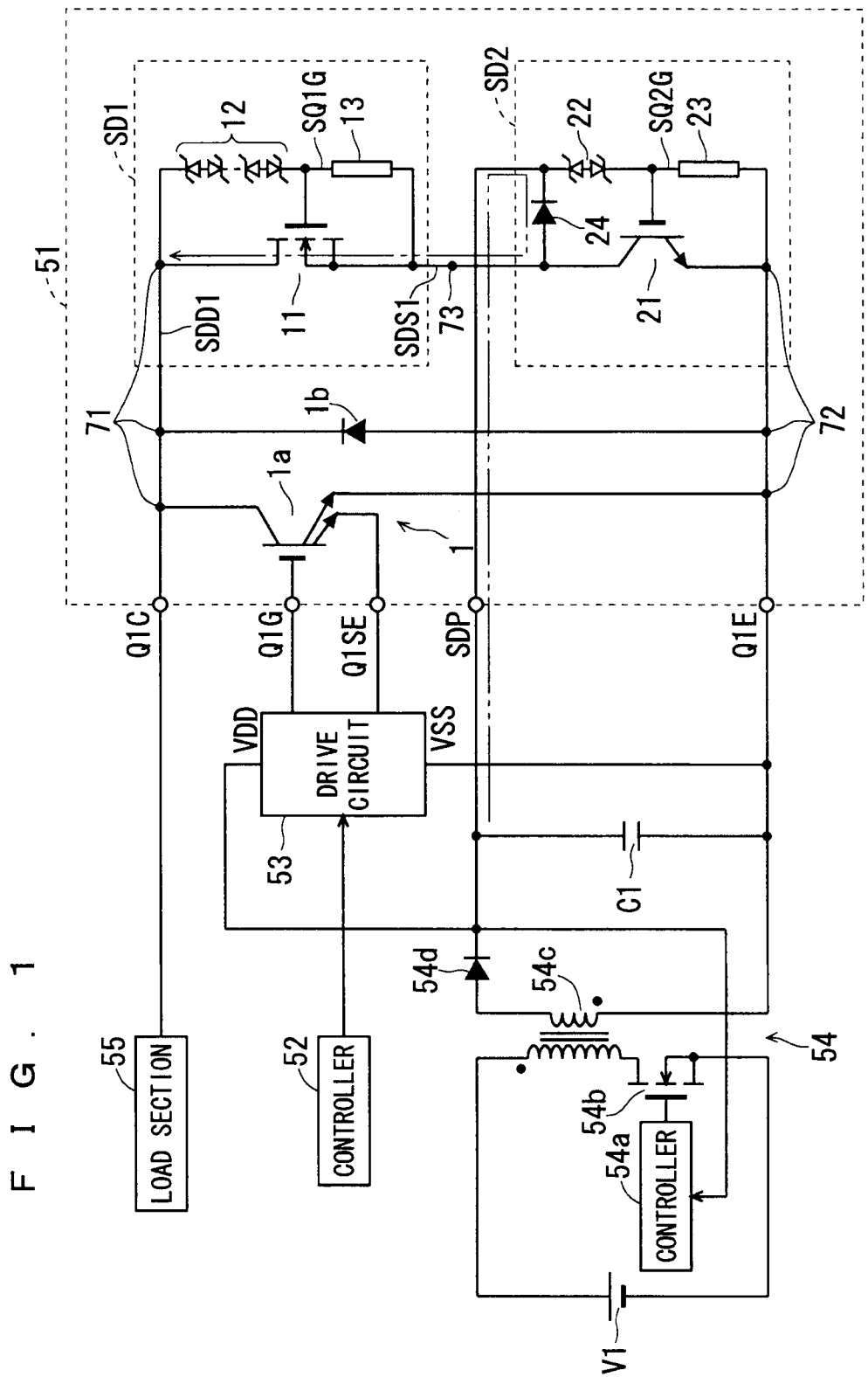
FIG. 1 is a circuit diagram showing the structure of a semiconductor device of a first preferred embodiment.

FIG. 1 is a circuit diagram showing the structure of a semiconductor device of a first preferred embodiment of the present invention. As shown in FIG. 1, the semiconductor device of the first preferred embodiment includes a semiconductor unit 51 surrounded by dashed lines, a drive circuit 53 for driving the semiconductor unit 51 based on control by a controller 52, a power source section 54 for supplying a DC voltage (electric power) to the drive circuit 53, and a load section 55 connected to the semiconductor unit 51.

The semiconductor unit 51 shown in FIG. 1 includes a parallel connection structure 1 in which an IGBT (insulated gate bipolar transistor) 1a as a main switching element and a recovery diode 1b as a first diode are connected in parallel between first and second nodes 71 and 72, and first and second snubber devices SD1 and SD2. The IGBT 1a is shown as the main switching element, to which the present invention is not intended to be limited. A MOSFET or a power transistor may also be used in place of the IGBT 1a as a main switching element. The semiconductor unit 51 includes a plurality of terminals Q1C, Q1G, Q1SE, SDP and Q1E (these may collectively be called "a plurality of terminals including Q1C") that are composed of a conductive frame made for example of copper.

Figure 2:
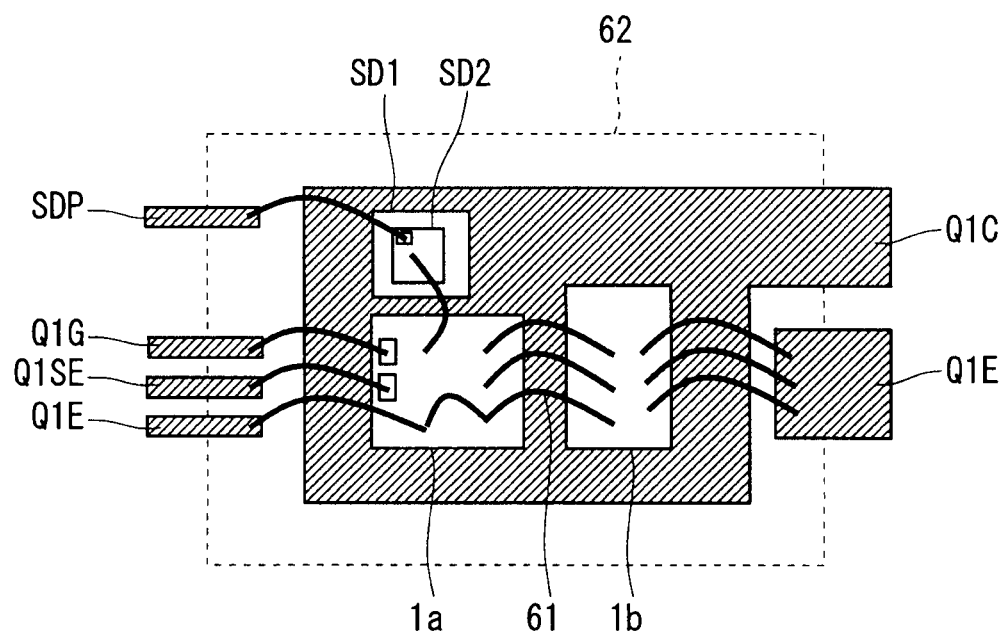
FIG. 2 is a plan view showing the structure of the semiconductor device of the first preferred embodiment.

FIG. 2 is a plan view showing the structure of the semiconductor unit 51 of the first preferred embodiment. As shown in FIG. 2, the IGBT 1a, the recovery diode 1b, and the first and second snubber devices SD1 and SD2 are appropriately connected through connecting wires 61 (such as aluminum wires). Further, the IGBT 1a, the recovery diode 1b, and the first and second snubber devices SD1 and SD2 are packaged together with the plurality of terminals including Q1C in a resin mold 62 while parts of the terminals including Q1C are exposed.

In the semiconductor unit 51 of the aforementioned structure, the first and second snubber devices SD1 and SD2 are capable of reducing a turn-off surge voltage to be generated during turn-off of the IGBT 1a, and capable of reducing a recovery surge voltage to be generated during turn-off of recovery diode 1b. Further, the first preferred embodiment is capable of making effective use of these surge voltages, making it possible to realize energy saving as described in more detail later.

Referring back to FIG. 1, the drive circuit 53 is connected to the gate terminal of the IGBT 1a through the terminal Q1G. In the first preferred embodiment, the drive circuit 53 is also connected through the terminal Q1SE to a current detecting emitter terminal of the IGBT 1a to monitor a current flowing in the current detecting emitter terminal. The drive circuit 53 connected in the aforementioned manner controls the gate voltage of the IGBT 1a based on a result of monitoring of this emitter terminal as well as on the control by the controller 52. To be specific, the drive circuit 53 is configured to control ON and OFF of the IGBT 1a. More specifically, if detecting abnormal operation of the current detecting emitter terminal of the IGBT 1a such as overcurrent, the drive circuit 53 controls ON and OFF of the IGBT 1a to protect the IGBT 1a. This means that the drive circuit 53 not only has a function of controlling the IGBT 1a, but also has a function of preventing the failure of the IGBT 1a to be caused by heat generated due to overcurrent and the like.

The power source section 54 is a DC voltage converter such as a flyback converter, and supplies electric power to the drive circuit 53 for driving the IGBT 1a. In the first preferred embodiment, the power source section 54 is a flyback converter including a power source V1 as an independent DC voltage source capable of applying an arbitrary voltage, a controller 54a, a MOSFET (metal-oxide-semiconductor field-effect transistor) 54b, a voltage converter 54c, a rectifying diode 54d for changing an AC voltage given from the voltage converter 54c to a DC voltage, and a smoothing capacitor C1 for smoothing the DC voltage obtained by the rectifying diode 54d.

The controller 54a receives a voltage charged in the smoothing capacitor C1. The controller 54a controls electric power to be given from the power source V1 to the voltage converter 54c based on the magnitude of this voltage. An actual situation is that, in order for the power source V1 to function as an independent power source, the voltage from the smoothing capacitor C1 is fed back to the controller 54a through a photocoupler or an isolation amplifier. However, in order to illustrate the structure of the semiconductor device simply, the voltage from the smoothing capacitor C1 is shown to be fed back directly to the controller 54a.

The load section 55 is connected through the terminal Q1C to the semiconductor unit 51. In the first preferred embodiment, the load section 55 is assumed to be an inductive load as an inductive load is a load generally used in many cases. However, an inductive load is not the only example of the load section 55, but the load section 55 may also be a capacitive load or a resistive load.

The aforementioned structure of the semiconductor unit 51 is described in more detail below.

As shown in FIG. 1, the collector terminal of the IGBT 1a is connected through the first node 71 to the cathode terminal of the recovery diode 1b, and the emitter terminal of the IGBT 1a is connected through the second node 72 to the anode terminal of the recovery diode 1b. Thus, in the first preferred embodiment, a direction from the second node 72 toward the first node 71 corresponds to the forward direction of the recovery diode 1b.

One terminal of the first snubber device SD1 indicated by dashed lines in FIG. 1 is connected through the first node 71 to one end of the parallel connection structure 1. The opposite terminal of the first snubber device SD1 is connected through a third node 73 to one terminal of the second snubber device SD2 indicated by dashed lines in FIG. 1. The opposite terminal of the second snubber device SD2 is connected through the second node 72 to the opposite end of the parallel connection structure 1. The terminals Q1C and Q1E are connected to the first and second nodes 71 and 72 respectively. The terminal SDP is connected through the second snubber device SD2 to the third node 73.

The structures of the first and second snubber devices SD1 and SD2 are described in more detail below.

The first snubber device SD1 includes a MOSFET 11, a plurality of Zener diodes 12, and a polysilicon resistor 13 as a first resistor. However, this is not the only structure of the first snubber device SD1. The structure of the first snubber device SD1 may also be such that an IGBT takes the place of the MOSFET 11.

In the first preferred embodiment, the first snubber device SD1 is made of a wide band gap material such as SiC. The MOSFET 11 is also made of a wide band gap material.

The MOSFET 11 has a drain terminal at one terminal of the first snubber device SD1 closer to the first node 71, and a source terminal at the opposite terminal of the first snubber device SD1 closer to the third node 73. The Zener diodes 12 are formed between the drain and gate terminals of the MOSFET 11, and the polysilicon resistor 13 is provided between the source and gate terminals of the MOSFET 11.

In the first snubber device SD1 of the aforementioned structure, a yield phenomenon occurs at the Zener diodes 12 if a voltage at the first node 71 exceeds a fixed voltage, causing a current to flow in the polysilicon resistor 13. As a result, a voltage is generated between the gate and source terminals of the MOSFET 11 to turn the MOSFET 11 on. This clamps the voltage at the first node 71 as this voltage becomes incapable of exceeding the aforementioned fixed voltage (clamp level). To be specific, the first snubber device SD1 actively clamps the voltage at the first node 71.

In the first preferred embodiment, the electric characteristic values of the MOSFET 11, the Zener diodes 12, and the polysilicon resistor 13 are determined such that the first snubber device SD1 has a clamp level (700 V, for example) which is the same as or higher than the output voltage of the power source section 54, and which does not exceed the breakdown voltage of the IGBT 1a.

The structure of the second snubber device SD2 is described next. The second snubber device SD2 includes an IGBT 21, a plurality of Zener diodes 22, a polysilicon resistor 23, and a diode 24 as a second diode. However, this is not the only structure of the second snubber device SD2. The structure of the second snubber device SD2 may also be such that a MOSFET takes the place of the IGBT 21. Further, the second snubber device SD2 may be made of a generally employed band gap material such as Si, or may be made of a wide band gap material such as SiC.

The IGBT 21 has a collector terminal at one terminal of the second snubber device SD2 closer to the third node 73, and an emitter terminal at the opposite terminal of the second snubber device SD2 closer to the second node 72. The Zener diodes 22 are formed between the collector and gate terminals of the IGBT 21, and the polysilicon resistor 23 is formed between the emitter and gate terminals of the IGBT 21. The diode 24 is provided between the third node 73 and the power source section 54 (between the third node 73 and the terminal SDP). A direction from the third node 73 toward the power source section 54 corresponds to the forward direction of the diode 24.

Like the first snubber circuit SD1, the snubber device SD2 of the aforementioned structure clamps a voltage at the third node 73 at a fixed voltage. In the first preferred embodiment, the electric characteristic values of the IGBT 21, the Zener diodes 22, the polysilicon resistor 23, and the diode 24 are determined such that the second snubber device SD2 has a clamp level which is the same as or higher than the output voltage of the power source section 54. Here, the clamp level of the second snubber device SD2 is made slightly higher than the output voltage of the power source section 54. As an example, if the output voltage of the power source section 54 is 15 V, the clamp level of the second snubber device SD2 is set at 17 V.

Figure 3:
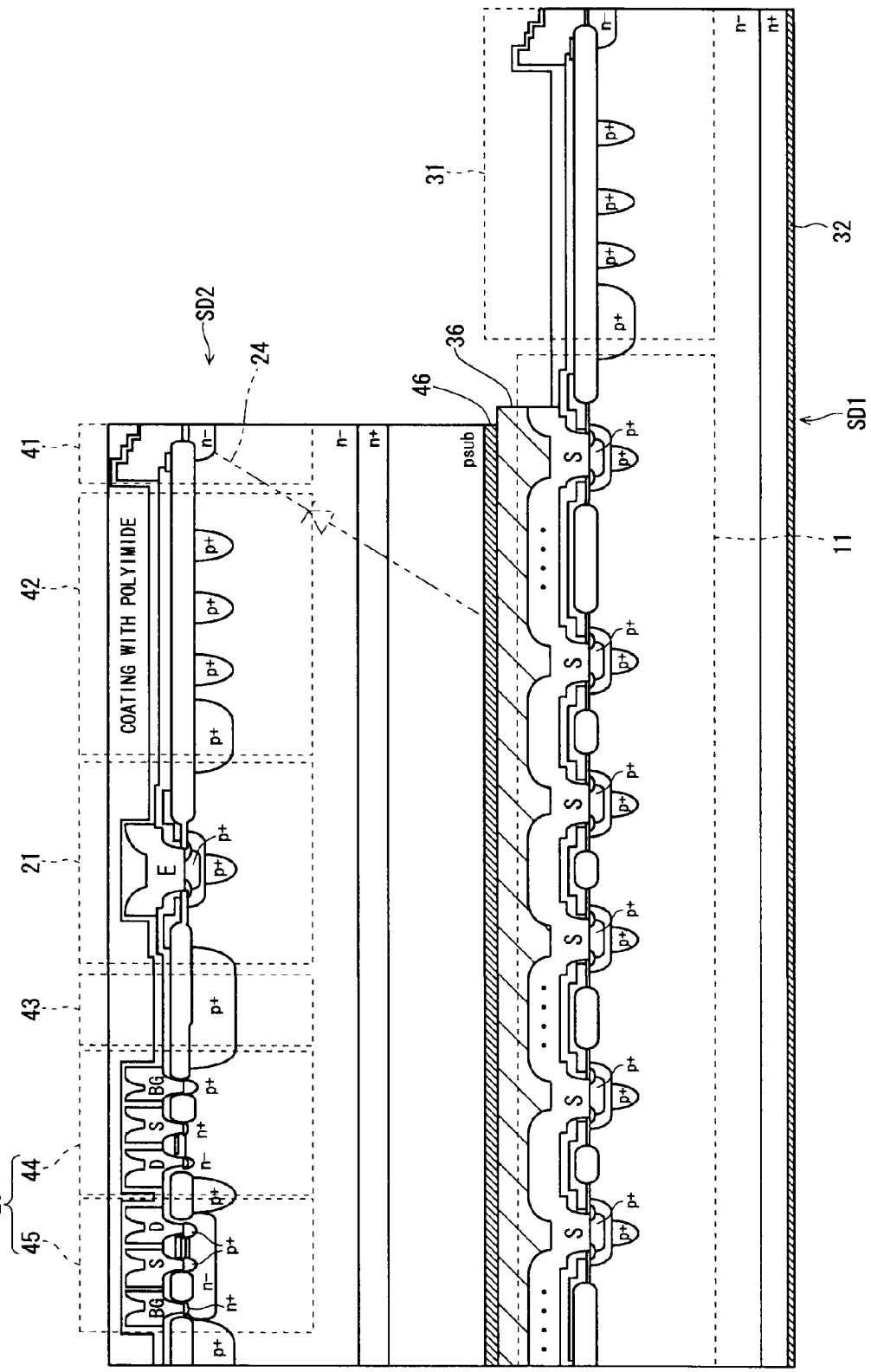
FIG. 3 is a sectional view showing the structures of first and second snubber devices of the first preferred embodiment.
Figure 4:
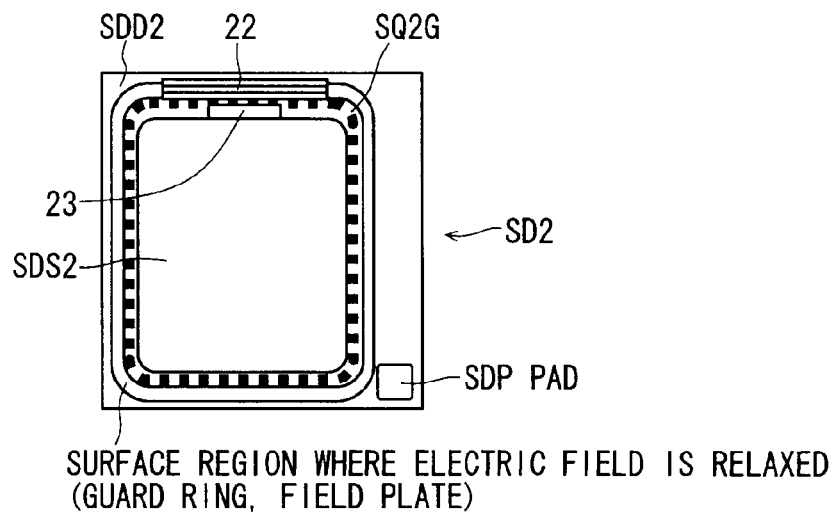
FIG. 4 is a plan view showing the structure of the second snubber device of the first preferred embodiment.

FIG. 3 is a sectional view showing exemplary structures of the first and second snubber devices SD1 and SD2. FIG. 4 is a plan view showing the exemplary structure of the second snubber device SD2.

A device including a guard ring area 31 in which the Zener diodes 12 are provided, the MOSFET 11, and the polysilicon resistor 13, is formed as the first snubber device SD1 in a semiconductor substrate shown in the lower part of FIG. 3 (hereinafter called "lower semiconductor substrate"). A drain electrode 32 of the MOSFET 11 is provided on the underside of the lower semiconductor substrate. The source and gate electrodes of the MOSFET 11, and others are provided on the upper side of the lower semiconductor substrate. The drain electrode 32 of the MOSFET 11 is connected to the terminal Q1C made of a conductive frame. The source electrode of the MOSFET 11 is connected through a conductive joining material 36 such as solder to the second snubber device SD2.

A device including a channel cut part 41 in which an SDP pad shown in FIG. 4 is provided, a guard ring area 42 in which the Zener diodes 22 are provided, the IGBT 21, the polysilicon resistor 23, an isolation region 43, and a CMOS circuit 25 with an N-type MOSFET 44 and a P-type MOSFET 45, is formed as the second snubber device SD2 in a semiconductor substrate shown in the upper part of FIG. 3 (hereinafter called "upper semiconductor substrate"). The CMOS circuit 25 is described in preferred embodiments following the first preferred embodiment, and it is not described in the first preferred embodiment.

A collector electrode 46 of the IGBT 21 is provided on the underside of the upper semiconductor substrate. The emitter and gate electrodes of the IGBT 21, and others are provided on the upper side of the upper semiconductor substrate. The collector electrode 46 of the IGBT 21 is connected through the conductive joining material 36 to the source electrode of the MOSFET 11. The emitter electrode of the IGBT 21 is connected through the connecting wires 61 shown in FIG. 2 to the IGBT 1a and others. The channel cut part 41 is connected to the terminal SDP through the SDP pad shown in FIG. 4 and the connecting wires 61 shown in FIG. 2 are placed in this order as viewed from the channel cut part 41.

In the first preferred embodiment, the diode 24 (FIG. 1) is provided as a diode parasitic to the IGBT 21 between the collector electrode 46 of the IGBT 21 and the channel cut part 41 (terminal SDP) as shown by two-dot chain lines of FIG. 3.

The MOSFET 11, the Zener diodes 12, and the polysilicon resistor 13 are formed in the same semiconductor substrate to form the first snubber device SD1, to which the present invention is not intended to be limited. These members may be provided as individual members (individual elements). This increases a device size slightly but makes it possible to form the first snubber device SD1 with inexpensive members, allowing reduction of the cost of the entire device compared to use of a customized product such as an integrated circuit. Likewise, the IGBT 21, the Zener diodes 22, the polysilicon resistor 23, and the diode 24 may be provided as individual members (individual elements) in the same semiconductor substrate to form the second snubber device SD2.

The operation of the semiconductor device of the first preferred embodiment is described next.

Referring to FIG. 1, while the IGBT 1a is driven, rapid current change is generated when the IGBT 1a is turned off. This current change makes it likely that a high turn-off surge voltage will be generated at the first node 71 in response to the floating inductance of a main circuit. Likewise, turn-off of the recovery diode 1b makes it likely that a recovery surge voltage will be generated at the first node 71. In either case, however, a voltage at the first node 71 is clamped at the clamp level of the first snubber device SD1 (700 V, for example) as described above. Further, clamping the first snubber device SD1 makes it likely that a high voltage will be generated at the third node 73. In this case, however, a voltage at the third node 73 is clamped at the clamp level of the second snubber device SD2 (17 V, for example) as described above.

Figure 5:
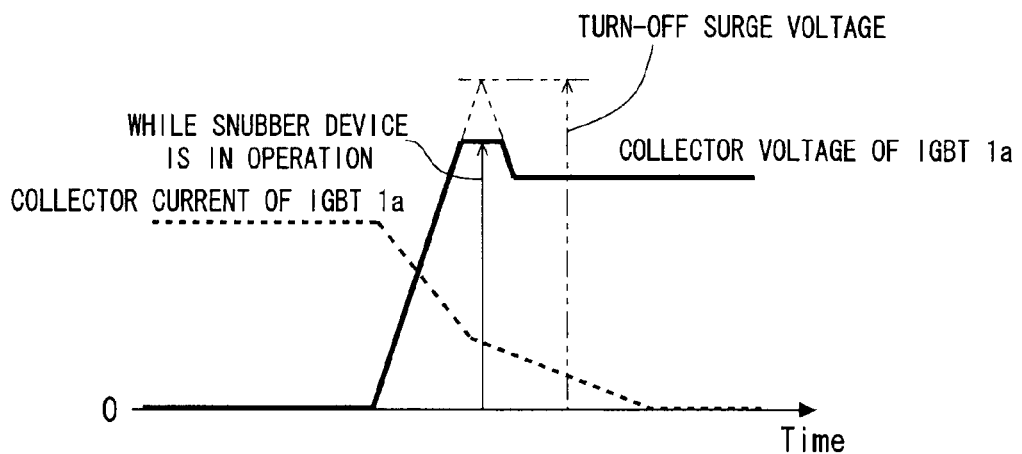
FIG. 5 is a view showing the operation of the semiconductor device of the first preferred embodiment.

FIG. 5 shows an effect achieved by the active clamping of the first and second snubber devices SD1 and SD2. The aforementioned operations of the first and second snubber devices SD1 and SD2 make it possible to reduce the surge voltage of the IGBT 1a and the like (indicated by a two-dot chain line) to a voltage indicated by a solid line as shown in FIG. 5. So, the semiconductor device of the first preferred embodiment is capable of broadening the safe operating areas (SOAs) of the IGBT 1a and the recovery diode 1b.

Some conventional semiconductor devices have a snubber device (snubber circuit). However, in these conventional semiconductor devices, a surge voltage is consumed as Joule heat in a member corresponding to the MOSFET 11, so they are regarded as undesirable in terms of energy saving.

In contrast, in the first preferred embodiment, electric power is fed back to the power source section 54 through the second and third nodes 72 and 73 (through the terminals SDP and Q1E). More specifically, a voltage at the third node 73 is charged in the smoothing capacitor C1 after passing through the diode 24 of the second snubber device SD2 and the terminal SDP. So, while a surge voltage is consumed uselessly in a conventional example, the power source section 54 is capable of using part of the surge voltage as electric power to be supplied to the drive circuit 53 next time. Thus, the energy of the surge voltage can be used effectively to realize energy saving.

In the aforementioned structure, the clamp level of the second snubber device SD2 is made slightly higher than the output voltage of the power source section 54. So, if electric power from the semiconductor unit 51 is fed back directly to the smoothing capacitor C1, a voltage higher than a voltage designed as the output voltage of the power source section 54 is charged in the smoothing capacitor C1. To be specific, a voltage slightly higher than the designed voltage is supplied to the drive circuit 53 in the aforementioned structure, and this may make an inappropriate situation depending on the drive circuit 53.

In response, the controller 54a controls electric power to be supplied from the power source V1 to the voltage converter 54c based on a voltage charged in the smoothing capacitor C1. As a result, the voltage of the smoothing capacitor C1 can be substantially the same as a voltage determined as the output voltage of the power source section 54 (such as 15 V as described above).

More specifically, if a voltage being the same as or higher than the output voltage (such as 15 V) of the power source section 54 is detected as the voltage of the smoothing capacitor C1, the controller 54a stops the switching operation of the MOSFET 54b. Then, the electric power of the smoothing capacitor C1 is consumed by the drive circuit 53 to reduce the voltage of the smoothing capacitor C1. At this time, current flow from the smoothing capacitor C1 to the voltage converter 54c is prevented by the rectifying diode 54d.

If a voltage lower than the output voltage of the power source section 54 is detected as the voltage of the smoothing capacitor C1, the controller 54a makes the switching operation of the MOSFET 54b. Then, electric power is fed back from the semiconductor unit 51 to increase the voltage of the smoothing capacitor C1.

The aforementioned structure makes it possible to maintain the voltage of the smoothing capacitor C1 at a desirable voltage, and to use energy stored in the smoothing capacitor C1 preferentially.

In the semiconductor device described above, if the recovery diode 1b is brought into a conducting state, the potential of the first node 71 becomes lower than the potential of the second node 72, thereby applying the voltage of the smoothing capacitor C1 to the MOSFET 11. At this time, if the diode 24 is not provided, a body diode (not shown) of the MOSFET 11 is brought into a conducting state, causing a current to flow from the smoothing capacitor C1 along a path indicated by an arrowed phantom line (two-dot chain line) of FIG. 1. In this case, electric charges may be released from the smoothing capacitor C1.

In contrast, provision of the diode 24 between the third node 73 and the power source section 54 in the first preferred embodiment allows prevention of the current flow along the arrowed path. Thus, the electric power of the smoothing capacitor C1 can be used reliably at the drive circuit 53, reliably allowing effective use of part of the energy of a surge voltage.

The diode 24 is described as a diode parasitic to the IGBT 21 in the first preferred embodiment. However, this is not the only example of the diode 24, but the diode 24 may be provided as an individual member. Meanwhile, providing the diode 24 as a diode parasitic to the IGBT 21 as in the first preferred embodiment allows size reduction of the semiconductor device.

The basic structure described above places its central focus on the IGBT 1a. Meanwhile, the same effect is achieved by an inverter bridge formed by providing two or more of such structures in combination. To be specific, the same effect is also achieved in an applied mechanism where the IGBT 1a is provided as a switching element of a single-phase bridge, a three-phase bridge, a three-level inverter bridge, and the like.

The semiconductor substrates of the first and second snubber devices SD1 and SD2 are connected (joined) through the conductive joining material 36 as shown in FIG. 3, to which the present invention is not intended to be limited. These semiconductor substrates may be joined by applying pressure. In addition, the semiconductor unit 51 is shown to be sealed with a resin mold. However, connections between the elements and a way of packaging are not limited to those described above as long as they are realized in the a circuit structure same as that of the aforementioned circuit structure.

Second Preferred Embodiment

Figure 6:
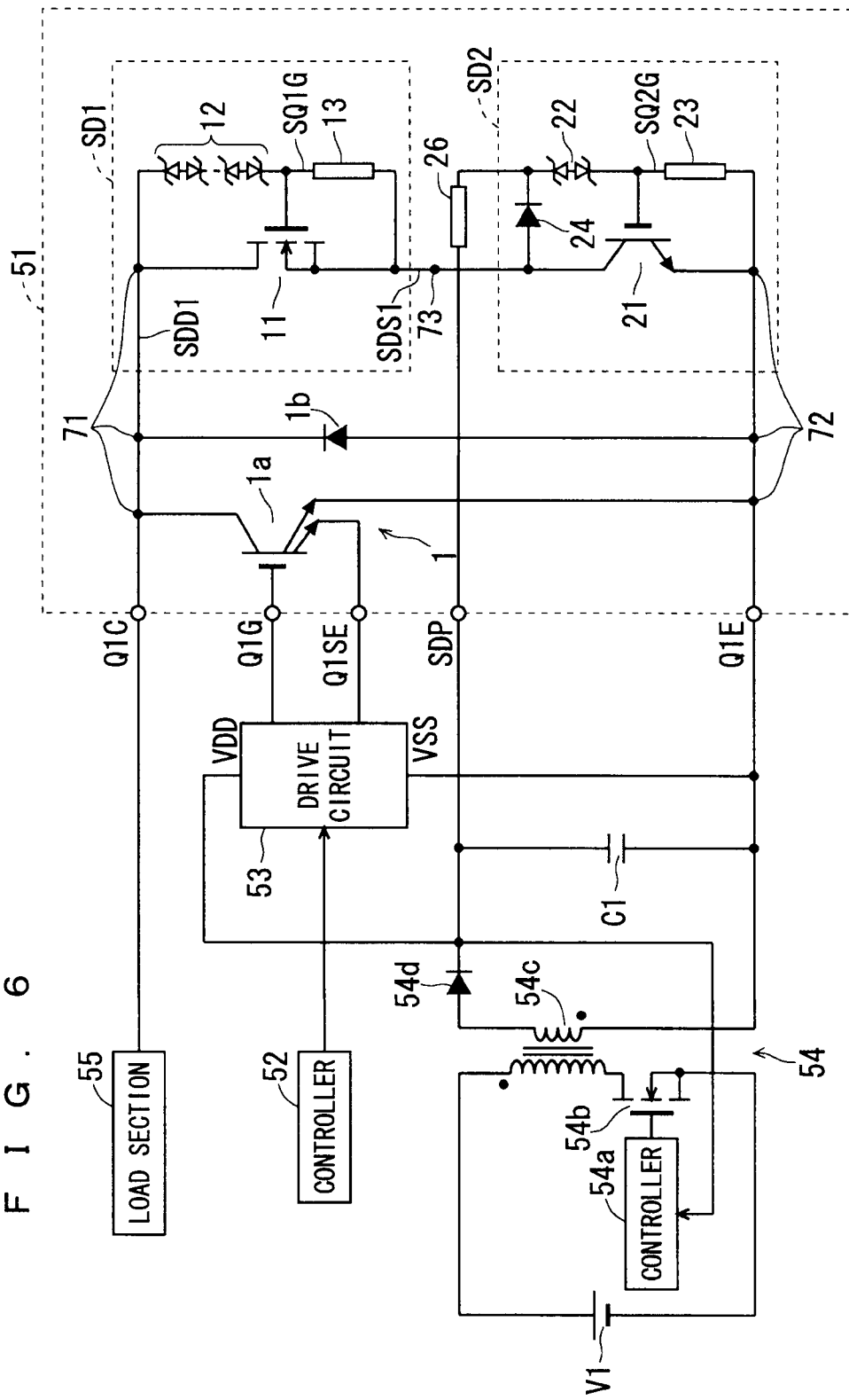
FIG. 6 is a circuit diagram showing the structure of a semiconductor device of a second preferred embodiment.

FIG. 6 is circuit diagram showing the structure of a semiconductor device of a second preferred embodiment of the present invention. In the following description of the semiconductor device of the second preferred embodiment, components similar to those of the first preferred embodiment are identified by the same reference numerals, and will not be described again.

The structure of the semiconductor device of the second preferred embodiment is formed by adding a resistor 26 as a second resistor to the structure of the semiconductor device of the first preferred embodiment. The resistor 26 is provided between the diode 24 and the power source section 54 (between the diode 24 and the terminal SDP). A surge voltage or a clamped voltage has a steep waveform as shown in FIG. 5. So, in the structure of the first preferred embodiment, a ripple current flows in the smoothing capacitor C1 while electric power is fed back to the smoothing capacitor C1, applying some load to the smoothing capacitor C1.

In contrast, in the semiconductor device of the second preferred embodiment, the aforementioned provision of the resistor 26 between the diode 24 and the power source section 54 makes the time constant of the smoothing capacitor C1 greater than that of the first preferred embodiment. This prevents flow of a ripple current toward the smoothing capacitor C1 to suppress generation of heat in the smoothing capacitor C1, making it possible to prolong the life span of the smoothing capacitor C1. Also, the noise level of the voltage of the smoothing capacitor C1 can be reduced, allowing stabilized circuit operation.

Third Preferred Embodiment

Figure 7:
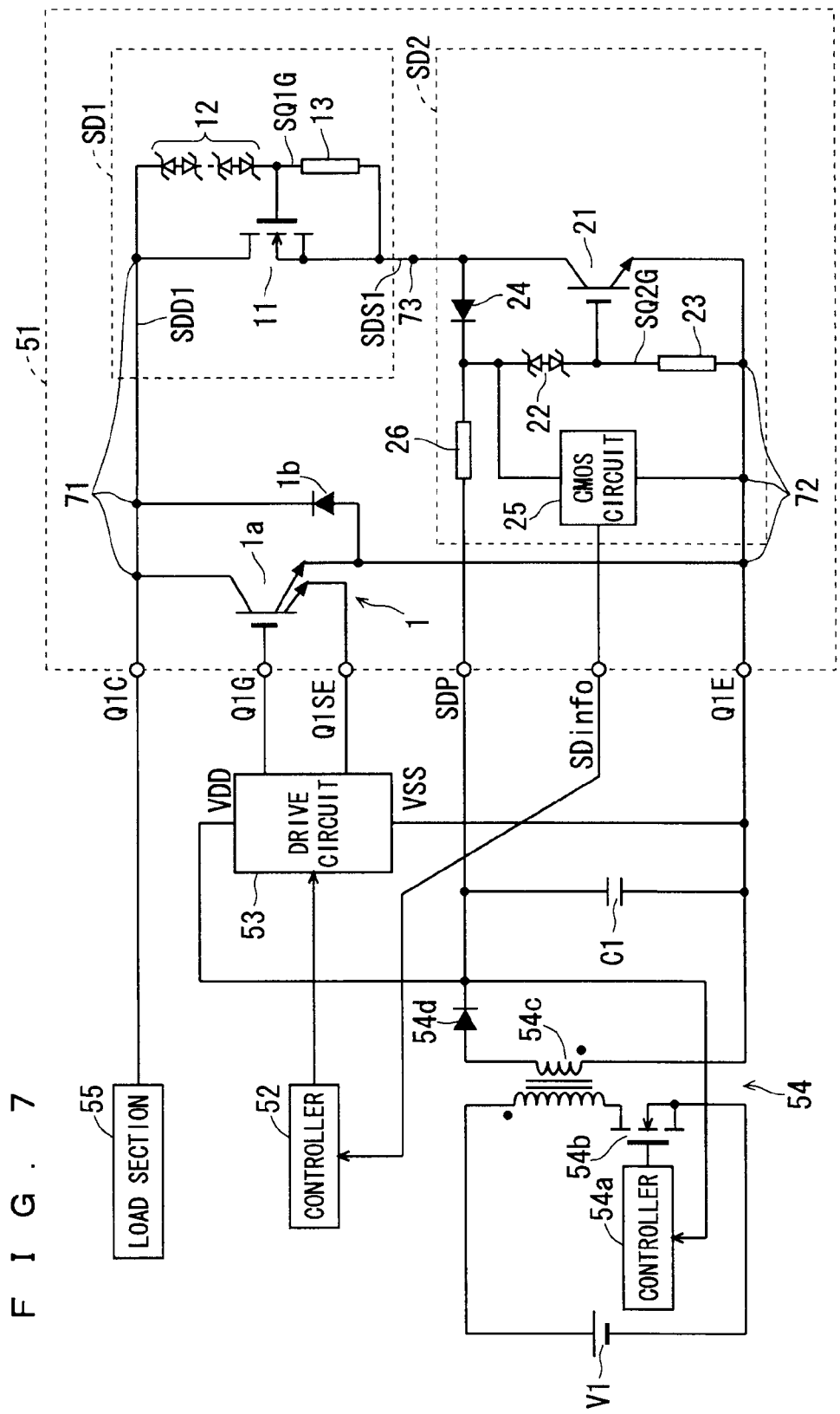
FIG. 7 is a circuit diagram showing the structure of a semiconductor device of a third preferred embodiment.
Figure 8:
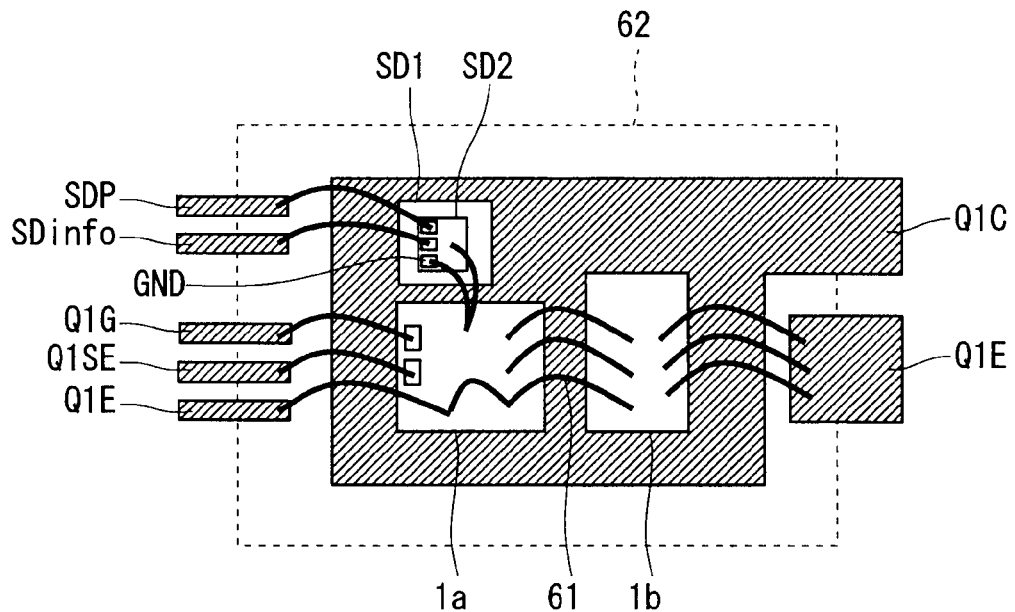
FIG. 8 is a plan view showing the structure of the semiconductor device of the third preferred embodiment.
Figure 9:
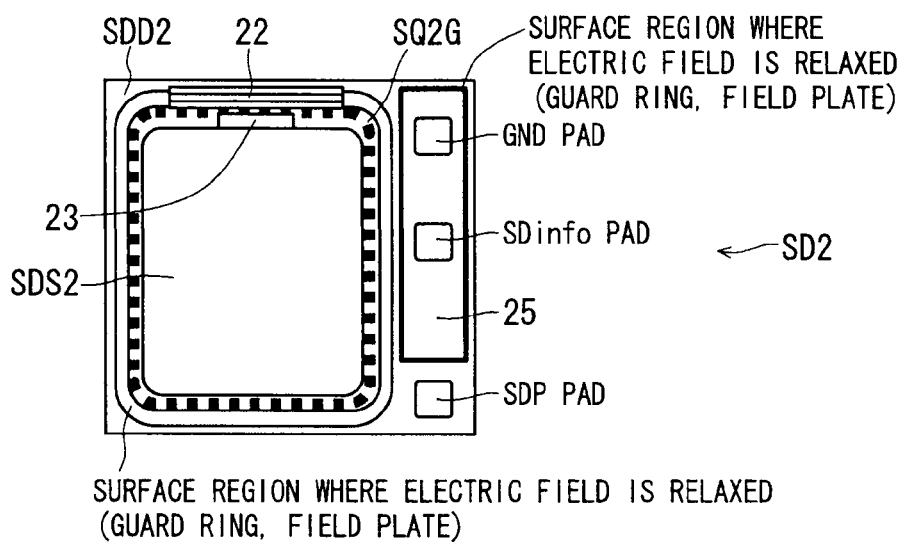
FIG. 9 is a plan view showing the structure of a second snubber device of the third preferred embodiment.

FIG. 7 is circuit diagram showing the structure of a semiconductor device of a third preferred embodiment of the present invention. FIG. 8 is a plan view showing the structure of the semiconductor unit 51 of the third preferred embodiment. FIG. 9 is a plan view showing an exemplary structure of the second snubber device SD2. In the following description of the semiconductor device of the third preferred embodiment, components similar to those of the second preferred embodiment are identified by the same reference numerals, and will not be described again.

The structure of the semiconductor device of the third preferred embodiment is formed by adding the CMOS circuit 25 to the structure of the semiconductor device of the second preferred embodiment. The CMOS circuit 25 is described briefly in the first preferred embodiment by referring to FIG. 3. The CMOS circuit 25 is formed in the upper semiconductor substrate in which the second snubber device SD2 is formed, meaning that it is formed in the same substrate as the IGBT 21. Thus, the CMOS circuit 25 is capable of monitoring the temperature of the IGBT 21. The upper semiconductor substrate in which the CMOS circuit 25 is formed is connected (joined) through the conductive joining material 36 to the lower semiconductor substrate in which the MOSFET 11 is formed. This provides comparatively good thermal coupling between the CMOS circuit 25 and the MOSFET 11, so that the CMOS circuit 25 is also capable of monitoring the temperature of the MOSFET 11.

Referring back to FIG. 7, in the third preferred embodiment, the CMOS circuit 25 is provided between the diode 24 and the second node 72 without the intervention of the resistor 26, and part of electric power to be fed back to the power source section 54 is supplied to the CMOS circuit 25. The CMOS circuit 25 uses electric power supplied thereto as a power source for realizing various operations including monitoring of the temperatures of the MOSFET 11 and the IGBT 21, and signal processing described later. As shown in FIGS. 7 and 8, the structure of the semiconductor unit 51 of the third preferred embodiment is formed by adding a terminal SDinfo to the structure of the semiconductor unit 51 of the first preferred embodiment.

The CMOS circuit 25 monitors the respective temperatures of the snubber devices SD1 and SD2, namely the respective temperatures of the MOSFET 11 and the IGBT 21, and generates a control signal for controlling the IGBT 1a based on a result of the monitoring. Then, the CMOS circuit 25 outputs the control signal to the controller 52 by making the control signal pass through an SDinfo pad shown in FIG. 9 and the terminal SDinfo in this order. If the temperatures of the MOSFET 11 and the IGBT 21 exceed their thresholds, for example, the CMOS circuit 25 determines that their temperatures are abnormal. Then, the CMOS circuit 25 outputs a control signal for reducing the temperatures to the controller 52. The control signal may be a signal indicated by a Boolean value, an analog signal, or a digital signal.

When receiving the aforementioned control signal, the controller 52 controls driving of the IGBT 1a via the drive circuit 53. As an example, when receiving a control signal to reduce temperatures from the CMOS circuit 25, the controller 52 shifts to a control mode in which the IGBT 1a is controlled to suppress switching loss to reduce the carrier frequency thereof, for example. As a result, generation of heat is suppressed in the MOSFET 11 and the IGBT 21.

In the semiconductor device of the third preferred embodiment, the CMOS circuit 25 controls the IGBT 1a based on monitoring of the temperatures of the MOSFET 11 and the IGBT 21. This makes it possible to reduce the probability of failure of the semiconductor device due to heat generation, and further, such an effect is achieved without requiring dedicated electric power supplied from outside.

Fourth Preferred Embodiment

Figure 10:
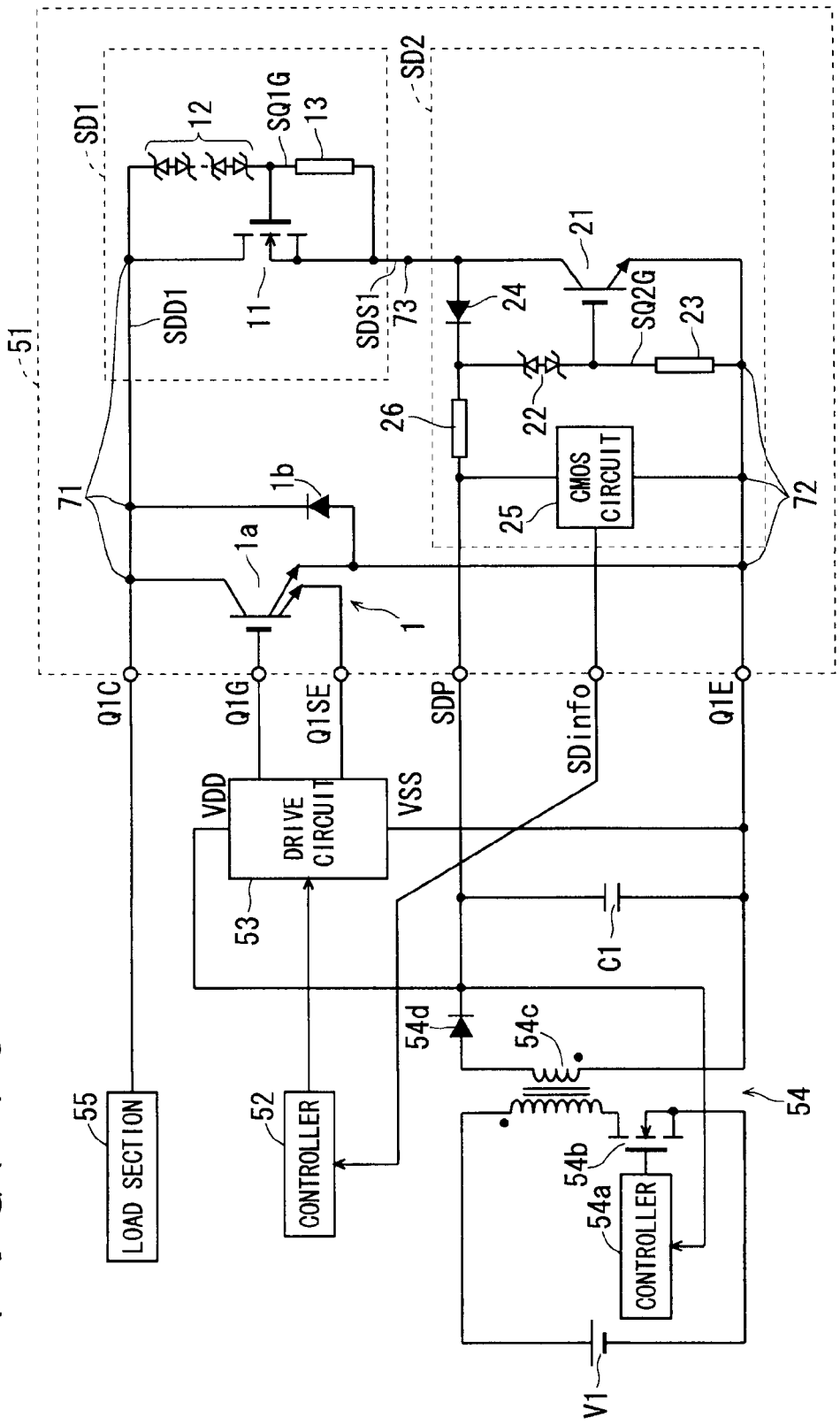
FIG. 10 is a circuit diagram showing the structure of a semiconductor device of a fourth preferred embodiment.

FIG. 10 is circuit diagram showing the structure of a semiconductor device of a fourth preferred embodiment of the present invention. In the following description of the semiconductor device of the fourth preferred embodiment, components similar to those of the third preferred embodiment are identified by the same reference numerals, and will not be described again. The semiconductor device of the fourth preferred embodiment is the same as the semiconductor device of the third preferred embodiment, except for that the resistor 26 is provided between the diode 24 and the CMOS circuit 25.

The semiconductor device of the fourth preferred embodiment achieves the same effect as that of the third preferred embodiment. Also, the level of noise contained in electric power supplied to the CMOS circuit 25 (power source noise) can be reduced, allowing stabilized circuit operation.

Fifth Preferred Embodiment

Figure 11:
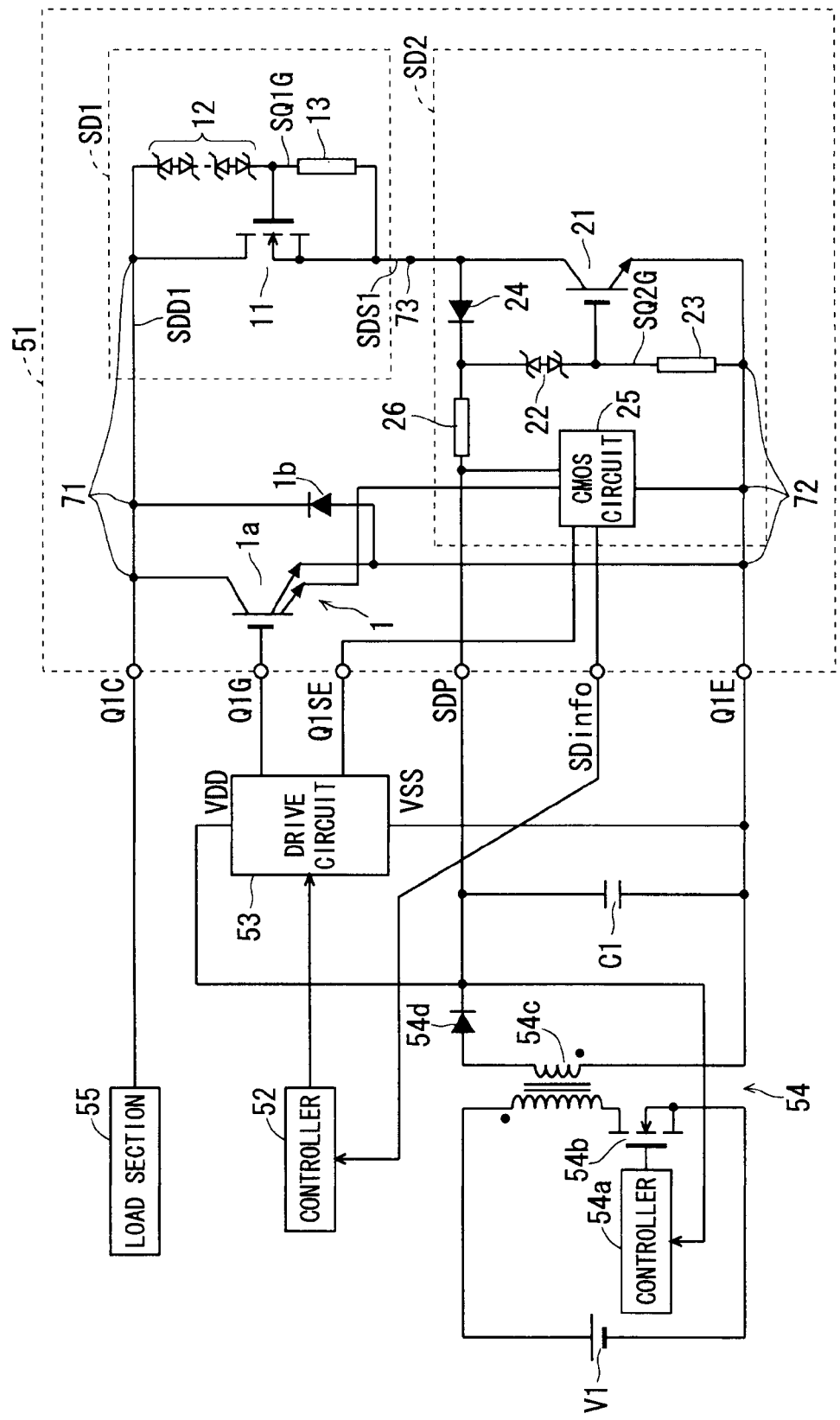
FIG. 11 is a circuit diagram showing the structure of a semiconductor device of a fifth preferred embodiment.

FIG. 11 is circuit diagram showing the structure of a semiconductor device of a fifth preferred embodiment of the present invention. In the following description of the semiconductor device of the fifth preferred embodiment, components similar to those of the fourth preferred embodiment are identified by the same reference numerals, and will not be described again.

In the first preferred embodiment, the drive circuit 53 is connected to the current detecting emitter terminal of the IGBT 1a, so the drive circuit 53 functions not only as a drive circuit but also as a protective circuit. Meanwhile, the capability of the current detecting emitter terminal of the IGBT 1a to withstand electrostatic breakdown is generally low. So, the current detecting emitter terminal should be treated carefully during the manufacture of a product in order to protect the current detecting emitter terminal from electrostatic breakdown.

In response, in the fifth preferred embodiment, the current detecting emitter terminal (current detecting terminal) of the IGBT 1a is connected to the CMOS circuit 25. The CMOS circuit 25 monitors a current flowing in the current detecting emitter terminal, and outputs a signal indicating a result of the monitoring that is for example a signal indicating generation of an abnormality such as overcurrent to the drive circuit 53.

In the semiconductor device of the fifth preferred embodiment, the CMOS circuit 25 generates a signal based on a current flowing in the current detecting emitter terminal having low capability to withstand electrostatic breakdown. To be specific, the CMOS circuit 25 is interposed in a path to the current detecting emitter terminal having low capability to withstand electrostatic breakdown, thereby enhancing performance to protect the IGBT 1a. As a result, capabilities to withstand impedance conversion and surge are enhanced, making it possible to realize a high-reliability semiconductor device.

The drive circuit 53 controls the operation of the IGBT 1a based on a signal given from the CMOS circuit 25. This suppress generation of heat in the IGBT 1a while making it possible for the IGBT 1a to shift to protected operation rapidly. Thus, the probability of the failure of the IGBT 1a due to overcurrent is reduced.

In the description given above, the current detecting terminal targeted for determination of overcurrent is the current detecting emitter terminal of the IGBT 1a, to which the present invention is not intended to be limited. As an example, the CMOS circuit 25 may generate an analog signal or a digital signal proportionate to a collector current, that is, the collector terminal of the IGBT 1a may be used as the current detecting terminal. In this case, the aforementioned effect is also achieved, and a current signal output from the CMOS circuit 25 is used after being processed by an external circuit.

In the description given above, an output signal from the CMOS circuit 25 is output to the outside of the semiconductor unit 51 through the two terminals SDinfo and Q1SE respectively, to which the present invention is not intended to be limited. In case the signals from the CMOS circuit 25 are output to one point. The signals to be multiplexed may be transmitted to a control system through one terminal. In this case, the aforementioned effect is also achieved.

Sixth Preferred Embodiment

Figure 12:
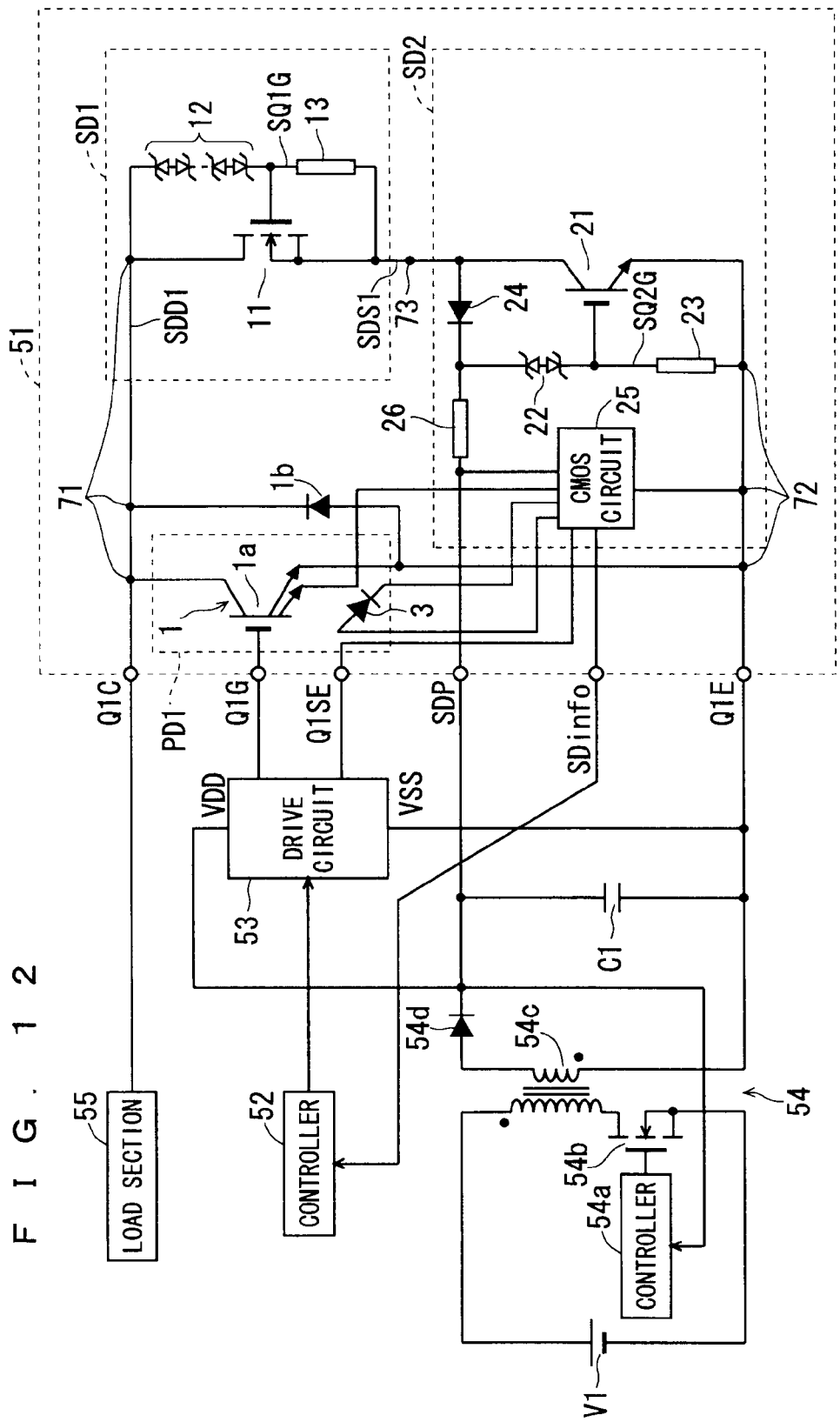
FIG. 12 is a circuit diagram showing the structure of a semiconductor device of a sixth preferred embodiment.

FIG. 12 is circuit diagram showing the structure of a semiconductor device of a sixth preferred embodiment of the present invention. In the following description of the semiconductor device of the sixth preferred embodiment, components similar to those of the fifth preferred embodiment are identified by the same reference numerals, and will not be described again.

The structure of the semiconductor device of the sixth preferred embodiment is formed by adding a temperature detecting diode 3 as a temperature detecting element for detecting the temperature of the IGBT 1a to the structure of the semiconductor device of the fifth preferred embodiment. As an example, the temperature detecting diode 3 is made of polysilicon, and formed on the IGBT 1a. The temperature detecting diode 3 is subjected to size limitations, and is considered to increase the probability of electrostatic breakdown if it is derived directly to the outside of a product.

So, in the sixth preferred embodiment, the temperature detecting diode 3 is connected to the CMOS circuit 25. The CMOS circuit 25 generates a signal based on a result of the detection made by the temperature detecting diode 3.

In the semiconductor device of the sixth preferred embodiment, the CMOS circuit 25 is interposed in a path to the temperature detecting diode 3 having low capability to withstand electrostatic breakdown, thereby enhancing performance to protect the temperature detecting diode 3. As a result, capabilities to withstand impedance conversion and surge are enhanced, making it possible to realize a high-reliability semiconductor device. Further, the CMOS circuit 25 is capable of generating a signal that can be handled easily by a following control system.

In the description given above, the temperature detecting diode 3 is used as the temperature detecting element, to which the present invention is not intended to be limited. An element having temperature dependency such as a thermistor is also applicable as the temperature detecting element.

Seventh Preferred Embodiment

Figure 13:
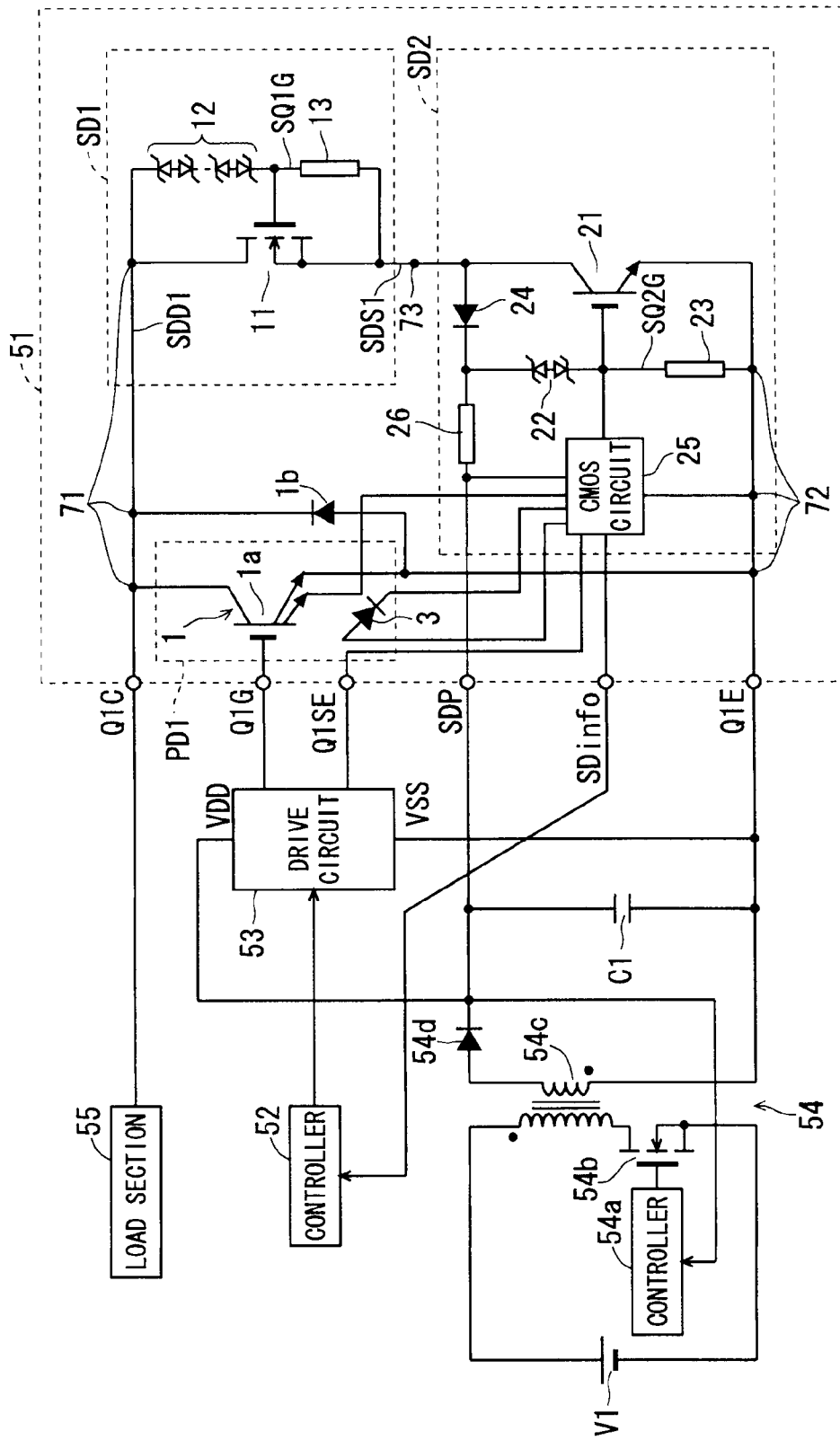
FIGS. 13 and 14 are circuit diagrams each showing the structure of a semiconductor device of a seventh preferred embodiment.

FIG. 13 is circuit diagram showing the structure of a semiconductor device of a seventh preferred embodiment of the present invention. In the following description of the semiconductor device of the seventh preferred embodiment, components similar to those of the sixth preferred embodiment are identified by the same reference numerals, and will not be described again.

In the semiconductor device of the seventh preferred embodiment, the CMOS circuit 25 is connected to the gate terminal of the IGBT 21. The CMOS circuit 25 monitors a signal at the gate terminal of the IGBT 21, and generates a control signal for controlling the IGBT 1*a* based on a result of the monitoring.

In the semiconductor device of the seventh preferred embodiment, a signal at the gate terminal of the IGBT 21 is monitored. To be specific, it can be determined if the second snubber device SD2 is actively clamped or not, making it possible to monitor the temperature of the IGBT 21 that varies depending on whether the second snubber device SD2 is actively clamped or not. As a result, a control signal for suppressing snubber loss can be output to a control circuit (here, the drive circuit 53) in response to a condition such as the temperature of the IGBT 21. Then, the drive circuit 53 shifts to a control mode in which the IGBT 1*a* is controlled to suppress switching loss to reduce the carrier frequency thereof, for example. As a result, generation of heat is suppressed in the MOSFET 11 and the IGBT 21. This makes it possible to reduce the probability of failure of the semiconductor device due to heat generation. Further, the driving speed and the switching frequency of the IGBT 1*a* can be controlled at a level that does not cause clamping of the second snubber device SD2.

Figure 14:
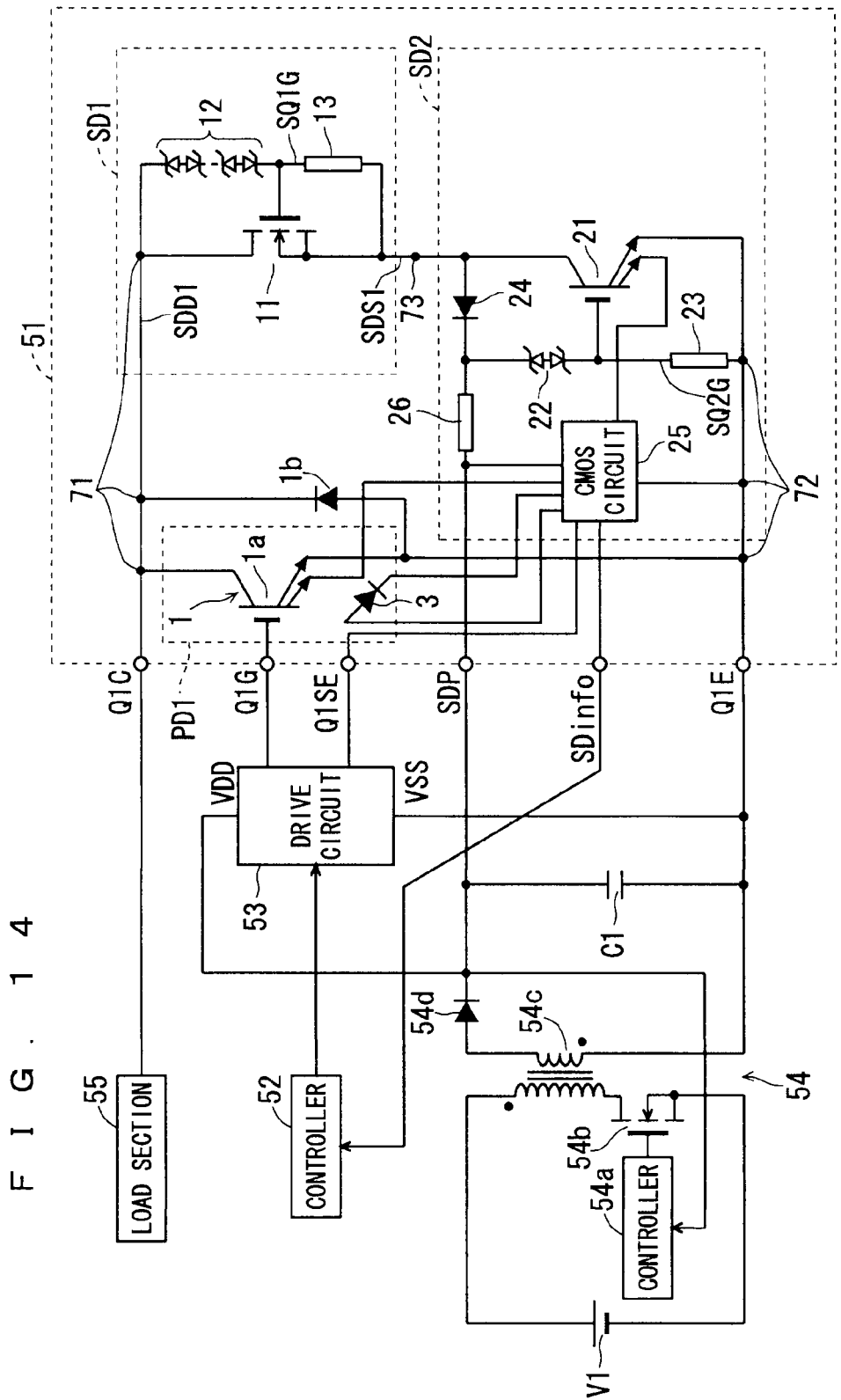

FIG. 14 is circuit diagram showing a different structure of the semiconductor device of the seventh preferred embodiment. In the semiconductor device shown in FIG. 14, the CMOS circuit 25 is connected to a current detecting emitter terminal of the IGBT 21. The CMOS circuit 25 monitors a signal at the current detecting emitter terminal of the IGBT 21, and generates a control signal for controlling the IGBT 1*a* based on a result of the monitoring.

The semiconductor device of this structure also makes it possible to reduce the probability of failure of the semiconductor device due to heat generation, and to control the driving speed and the switching frequency of the IGBT 1*a* at a level that does not cause clamping of the second snubber device SD2.

Eighth Preferred Embodiment

Figure 15:
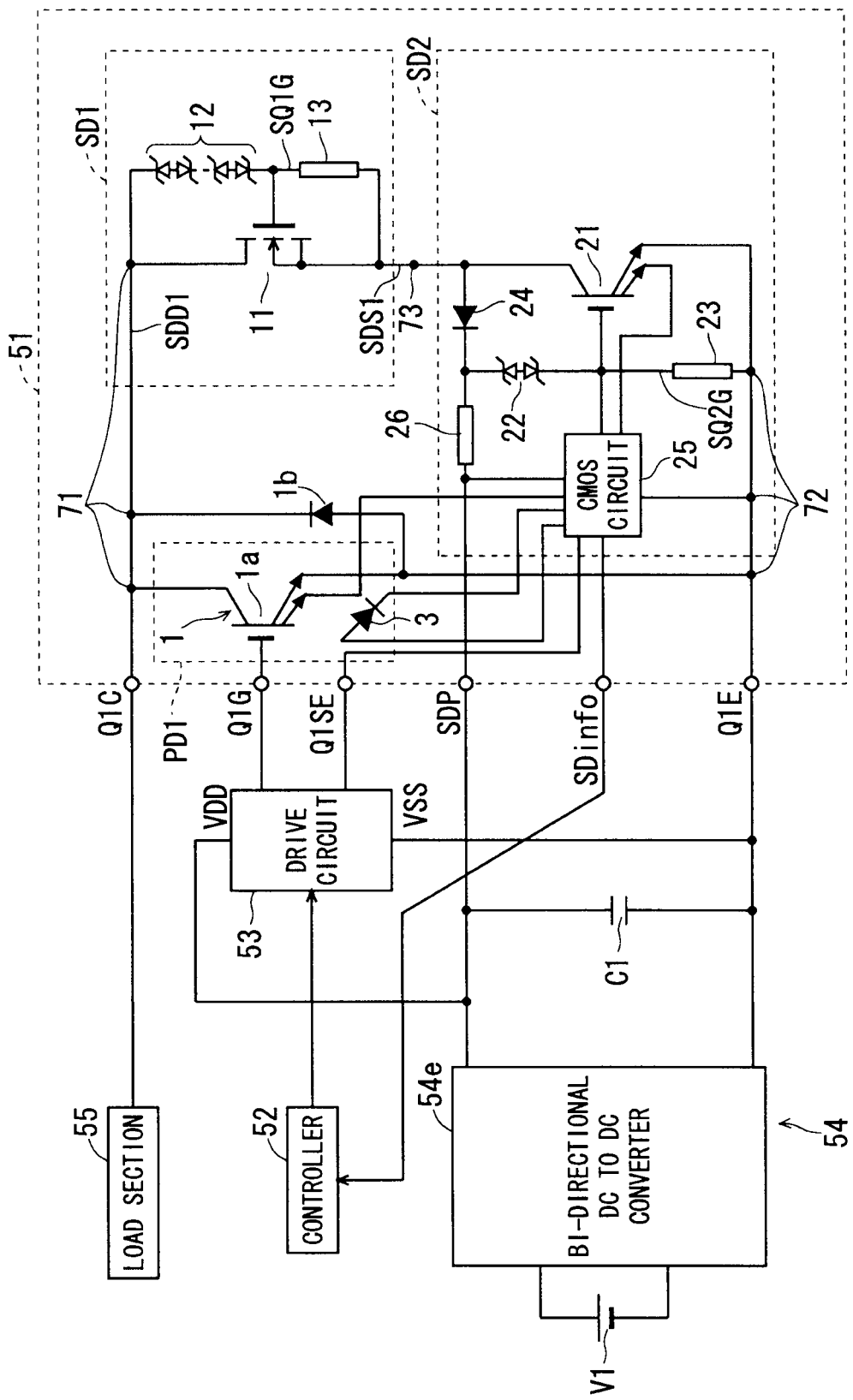
FIG. 15 is a circuit diagram showing the structure of a semiconductor device of an eighth preferred embodiment.

FIG. 15 is circuit diagram showing the structure of a semiconductor device of an eighth preferred embodiment of the present invention. In the following description of the semiconductor device of the eighth preferred embodiment, components similar to those of the seventh preferred embodiment described by referring to FIG. 14 are identified by the same reference numerals, and will not be described again.

In the aforementioned preferred embodiments, the power source section 54 is a flyback converter that cannot make reverse power flow. In contrast, in the eighth preferred embodiment, the power source section 54 includes a bi-directional DC to DC converter (bi-directional converter) 54*e* capable of supplying electric power fed back from the semiconductor unit 51 to a circuit other than the drive circuit 53.

In the semiconductor device of the eighth preferred embodiment, part of the energy of a surge voltage is fed back as electric power to the power source V1, meaning that the fed back electric power can be supplied to a circuit other than the drive circuit 53. This provides a different way of reuse of energy.

Ninth Preferred Embodiment

Figure 16:
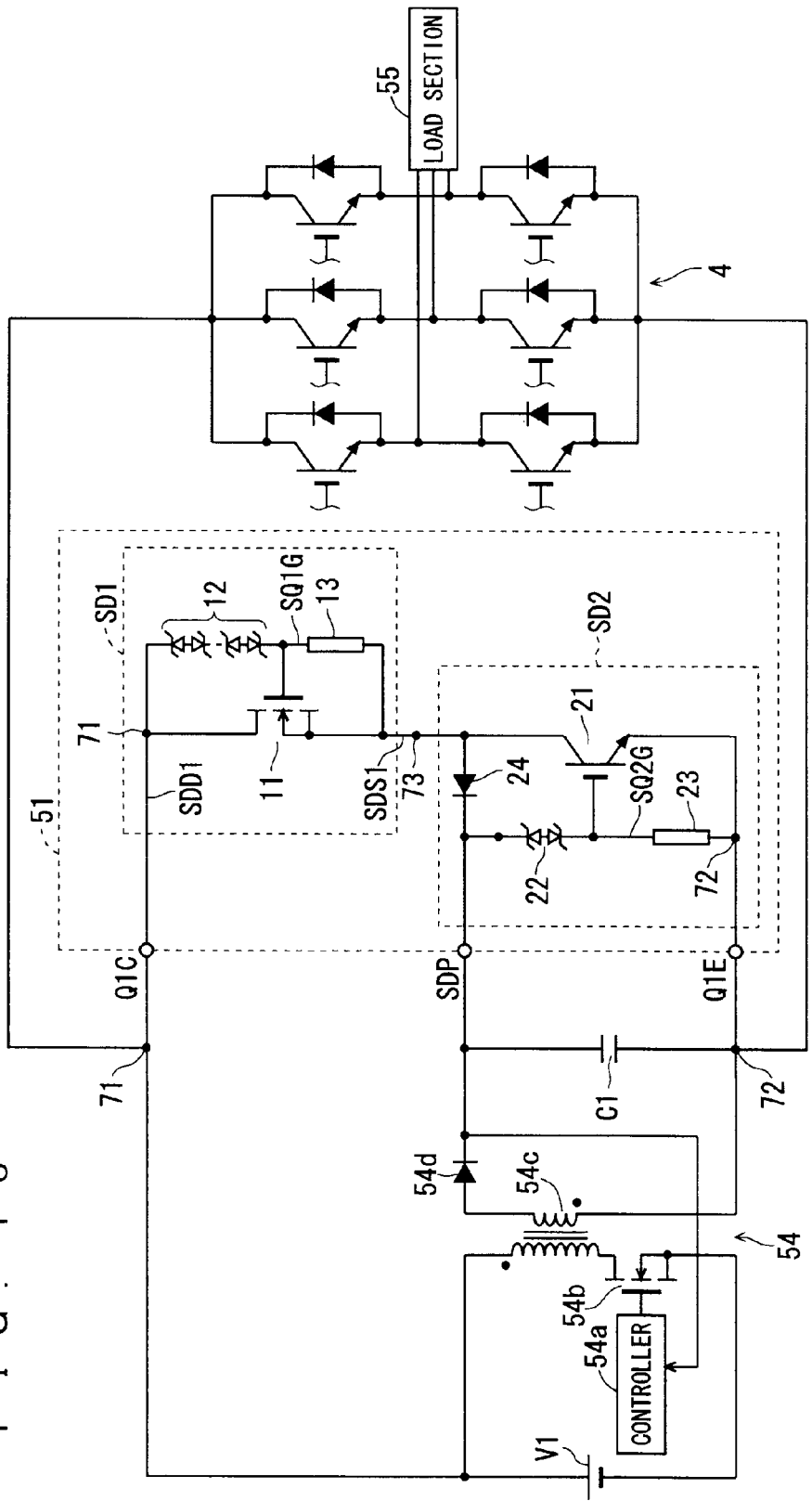
FIG. 16 is a circuit diagram showing the structure of a semiconductor device of a ninth preferred embodiment.

FIG. 16 is circuit diagram showing the structure of a semiconductor device of a ninth preferred embodiment of the present invention. In the following description of the semiconductor device of the ninth preferred embodiment, components similar to those of the aforementioned preferred embodiments are identified by the same reference numerals, and will not be described again.

The semiconductor device of the ninth preferred embodiment includes an inverter bridge 4 in place of the parallel connection structure 1 (IGBT 1*a* and recovery diode 1*b*) in the aforementioned preferred embodiments. The inverter bridge 4 by itself is formed as a single snubber.

The structure with the inverter bridge 4 also makes it possible to absorb and recovery the energy of a surge voltage fed back to the DC power source V1. The ninth preferred embodiment employs a structure with a single snubber whereas the aforementioned preferred embodiments employ a structure with individual snubbers, so that the ninth preferred embodiment is capable of reducing the cost of the semiconductor device.

The second snubber device SD2 shown in FIG. 16 does not include the CMOS circuit 25. However, the second snubber device SD2 of FIG. 16 may include the CMOS circuit 25 for processing a temperature monitoring signal, a current sensing signal of a transistor in a low-voltage stage (lower stage) of the inverter bridge 4, and a signal of a temperature sensing element. Further, like in the eight preferred embodiment, the power source section 54 of the ninth preferred embodiment may be a bi-directional DC to DC converter.

Tenth Preferred Embodiment

Figure 17:
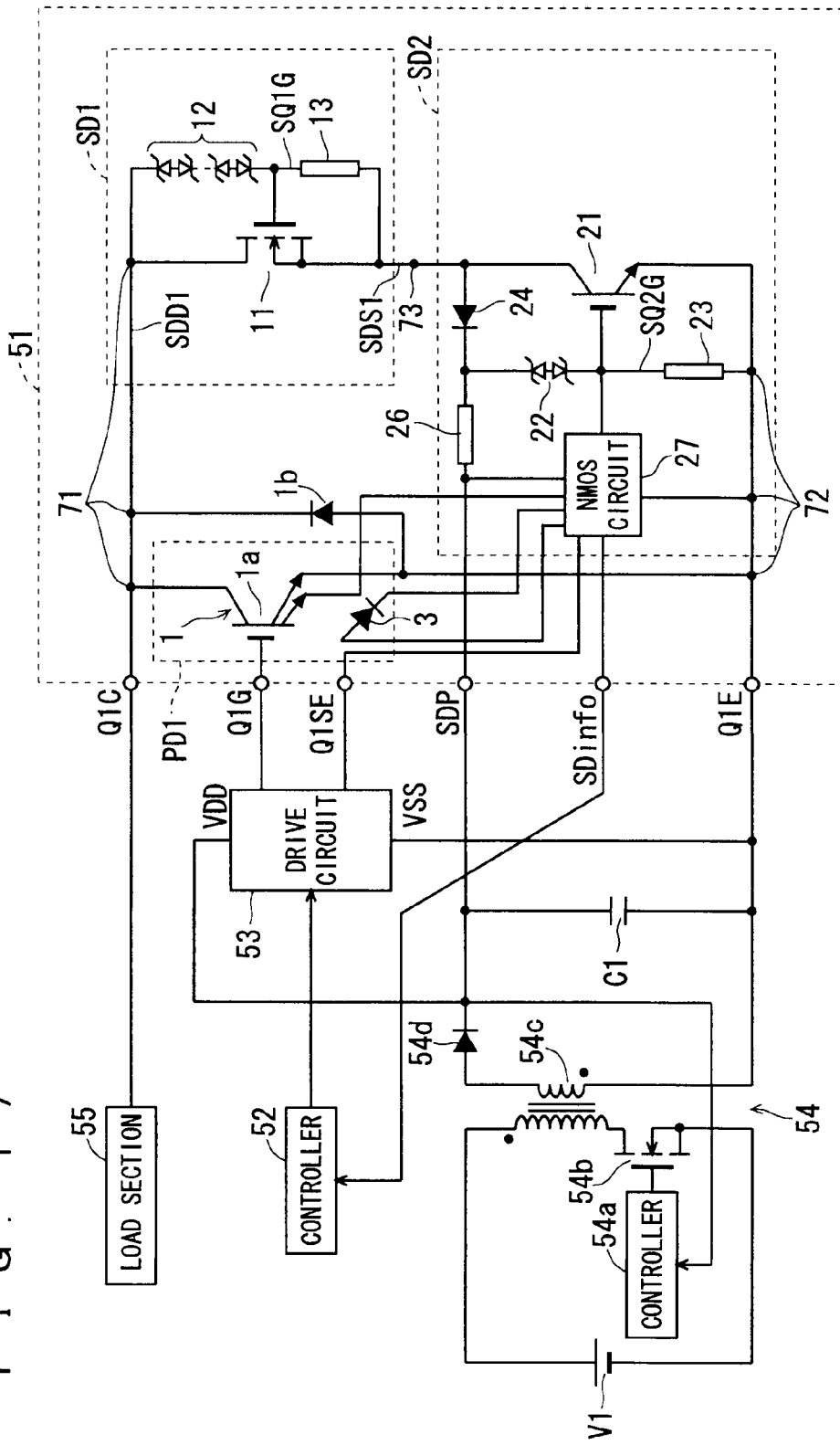
FIG. 17 is a circuit diagram showing the structure of a semiconductor device of a tenth preferred embodiment.

FIG. 17 is circuit diagram showing the structure of a semiconductor device of a tenth preferred embodiment of the present invention. In the following description of the semiconductor device of the tenth preferred embodiment, components similar to those of the seventh preferred embodiment described by referring to FIG. 13 are identified by the same reference numerals, and will not be described again.

The semiconductor device of the tenth preferred embodiment includes an NMOS circuit 27 in place of the CMOS circuit 25 in the aforementioned preferred embodiments. This eliminates the step of forming a p-channel required to form the CMOS circuit 25, so that the semiconductor device can be formed at a lower cost. If the semiconductor device can be formed by a more inexpensive process, a bipolar transistor can take the place of the CMOS circuit 25. Or, in order to place importance on the performance of the circuit, a bipolar circuit or a BiCMOS circuit may take the place of the CMOS circuit 25.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a parallel connection structure in which a main switching element and a first diode are connected in parallel between a first node and a second node;
   a first snubber device having a clamp level that does not exceed the breakdown voltage of said main switching element; and
   a second snubber device having a clamp level that is the same as or higher than the output voltage of a power source section for supplying electric power to a drive circuit for driving said main switching element, wherein
   one terminal of said first snubber device is connected through said first node to one end of said parallel connection structure, the opposite terminal of said first snubber device is connected through a third node to one terminal of said second snubber device, and the opposite terminal of said second snubber device is connected through said second node to the opposite end of said parallel connection structure, and
   electric power is fed back to said power source section through said second and third nodes.

2. The semiconductor device according to claim 1, further comprising a second diode provided between said third node and said power source section, the forward direction of the second diode corresponding to a direction from said third node toward said power source section.

3. The semiconductor device according to claim 1, wherein said first snubber device includes:
   a MOSFET made of a wide band gap material, the MOSFET having a drain terminal at said one terminal of said first snubber device, and a source terminal at said opposite terminal of said first snubber device;
   a Zener diode formed between said drain terminal and a gate terminal of said MOSFET; and
   a first resistor formed between said source and gate terminals of said MOSFET,
   said second snubber device includes an IGBT having a collector terminal corresponding to said one terminal of said second snubber device, and an emitter terminal corresponding to said opposite terminal of said second snubber device, and
   the forward direction of said first diode corresponds to a direction from said second node toward said first node.

4. The semiconductor device according to claim 3, further comprising
   a second diode provided between said third node and said power source section, the forward direction of the second diode corresponding to a direction from said third node toward said power source section, wherein
   said second diode is a diode parasitic to said IGBT.

5. The semiconductor device according to claim 3, further comprising
   a second diode provided between said third node and said power source section, the forward direction of the second diode corresponding to a direction from said third node toward said power source section, and
   a second resistor provided between said second diode and said power source section.

6. The semiconductor device according to claim 5, further comprising
   a CMOS circuit for monitoring the temperatures of said MOSFET and said IGBT, and generating a control signal for controlling said main switching element based on a result of the monitoring, wherein
   said CMOS circuit is provided between said second diode and said second node, and
   part of said electric power to be fed back to said power source section is supplied to said CMOS circuit.

7. The semiconductor device according to claim 6, wherein said second resistor is provided between said second diode and said CMOS circuit.

8. The semiconductor device according to claim 6, wherein said CMOS circuit generates a signal based on a current flowing in a current detecting terminal of said main switching element.

9. The semiconductor device according to claim 6, further comprising
   a temperature detecting element for detecting the temperature of said main switching element, wherein
   said CMOS circuit generates a signal based on a result of the detection made by said temperature detecting element.

10. The semiconductor device according to claim 6, wherein said CMOS circuit monitors a signal at a gate terminal of said IGBT, and generates a control signal for controlling said main switching element based on a result of the monitoring.

11. The semiconductor device according to claim 6, wherein said CMOS circuit monitors a signal at a current detecting terminal of said IGBT, and generates a control signal for controlling said main switching element based on a result of the monitoring.

12. The semiconductor device according to claim 6, comprising any one of an NMOS circuit, a bipolar circuit, and a BiCMOS circuit in place of said CMOS circuit.

13. The semiconductor device according to claim 1, comprising an inverter bridge in place of said parallel connection structure.

14. The semiconductor device according to claim 3, wherein said MOSFET, said Zener diode, and said first resistor are individual members independent of one another.

15. A semiconductor device, comprising a semiconductor unit and a power source section, wherein
   said semiconductor unit includes:
   a parallel connection structure in which a main switching element and a first diode are connected in parallel between a first node and a second node;
   a first snubber device having a clamp level that does not exceed the breakdown voltage of said main switching element; and
   a second snubber device having a clamp level that is the same as or higher than the output voltage of said power source section for supplying electric power to a drive circuit for driving said main switching element,
   one terminal of said first snubber device is connected through said first node to one end of said parallel connection structure, the opposite terminal of said first snubber device is connected through a third node to one terminal of said second snubber device, and the opposite terminal of said second snubber device is connected through said second node to the opposite end of said parallel connection structure, and electric power is fed back to said power source section through said second and third nodes.

16. The semiconductor device according to claim 15, comprising a bi-directional converter capable of supplying electric power to be fed back from said semiconductor unit to a circuit other than said drive circuit.

* * * * *